US009684073B2

United States Patent
Nakabayashi et al.

(10) Patent No.: US 9,684,073 B2
(45) Date of Patent: Jun. 20, 2017

(54) RADAR APPARATUS

(71) Applicant: DENSO CORPORATION, Kariya, Aichi-pref. (JP)

(72) Inventors: Kento Nakabayashi, Anjo (JP); Hiromitsu Onoda, Toyohashi (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 346 days.

(21) Appl. No.: 14/415,649

(22) PCT Filed: Jun. 3, 2013

(86) PCT No.: PCT/JP2013/065336
§ 371 (c)(1),
(2) Date: Jan. 19, 2015

(87) PCT Pub. No.: WO2014/013806
PCT Pub. Date: Jan. 23, 2014

(65) Prior Publication Data
US 2015/0177375 A1 Jun. 25, 2015

(30) Foreign Application Priority Data
Jul. 20, 2012 (JP) .................... 2012-161621

(51) Int. Cl.
*G01S 13/00* (2006.01)
*G01S 13/93* (2006.01)
(Continued)

(52) U.S. Cl.
CPC ............. *G01S 13/931* (2013.01); *G01S 7/03* (2013.01); *G01S 7/032* (2013.01); *G01S 13/345* (2013.01);
(Continued)

(58) Field of Classification Search
CPC .... G01S 13/345; G01S 13/584; G01S 13/931; G01S 2007/028; G01S 2013/9325;
(Continued)

(56) References Cited

U.S. PATENT DOCUMENTS 6,120,906 A    9/2000 Terashi
6,130,640 A *  10/2000 Uematsu ................. G01S 7/032
                                                        342/175

(Continued)

FOREIGN PATENT DOCUMENTS

JP    H09252217 A    9/1997
JP    H10261917 A    9/1998
(Continued)

OTHER PUBLICATIONS

International Search Report (in Japanese with English Translation) for PCT/JP2013/065336, mailed Jul. 2, 2013; ISA/JP.
(Continued)

*Primary Examiner* — Timothy A Brainard
(74) *Attorney, Agent, or Firm* — Harness, Dickey & Pierce, P.L.C.

(57) ABSTRACT

A radar apparatus includes an antenna section that transmits and receives a radar wave, a high-frequency circuit section that handles a high-frequency signal, and a low-frequency circuit section that handles a low-frequency signal. The low-frequency circuit section is arranged on a major face of a main printed board. The high-frequency circuit section and the antenna section are arranged respectively on first and second faces of a secondary printed board. Moreover, the secondary printed board is mounted to a space on the major face of the main printed board which is not occupied by the low-frequency circuit section. Consequently, it becomes possible to use the high-frequency signal by using an
(Continued)

insulating material, which is necessary for suppression of dielectric loss, only for the secondary printed board.

5 Claims, 5 Drawing Sheets

(51) Int. Cl.
*G01S 13/34* (2006.01)
*G01S 13/58* (2006.01)
*G01S 7/03* (2006.01)
G01S 7/02 (2006.01)
H01Q 1/32 (2006.01)
H01Q 21/06 (2006.01)

(52) U.S. Cl.
CPC ....... *G01S 13/584* (2013.01); *G01S 2007/028* (2013.01); *G01S 2013/935* (2013.01); *G01S 2013/9325* (2013.01); *G01S 2013/9346* (2013.01); *H01Q 1/3233* (2013.01); *H01Q 21/061* (2013.01)

(58) Field of Classification Search
CPC ....... G01S 2013/9346; G01S 2013/935; G01S 7/03; G01S 7/032; H01Q 1/3233; H01Q 21/061
USPC ........................................................ 342/118
See application file for complete search history.

(56) References Cited

U.S. PATENT DOCUMENTS

| 2003/0103009 | A1 | 6/2003 | Schmidt et al. |
| 2007/0159380 | A1 | 7/2007 | Nagaishi et al. |
| 2009/0251362 | A1 | 10/2009 | Margomenos et al. |
| 2010/0218985 | A1 | 9/2010 | Kouya |
| 2010/0226110 | A1 | 9/2010 | Kouya |

FOREIGN PATENT DOCUMENTS

| JP | H10-275963 | A | 10/1998 |
| JP | 2004-087638 | A | 3/2004 |
| JP | 2004518143 | A | 6/2004 |
| JP | 2007158555 | A | 6/2007 |
| JP | 2008252207 | A | 10/2008 |
| JP | 2009141386 | A | 6/2009 |
| JP | 2009-194783 | A | 8/2009 |
| JP | 2009236660 | A | 10/2009 |
| JP | 2010038834 | A | 2/2010 |
| JP | 2010205772 | A | 9/2010 |
| JP | 2010212375 | A | 9/2010 |

OTHER PUBLICATIONS

Written Opinion for PCT/JP2013/065336, mailed Jul. 2, 2013; ISA/JP.
Nidhi Khandelwal et al., "An X-band System-in-Package Active Antenna Module", Dec. 31, 2015, Microsave Symposium Digest, 2005 IEEE MTT-S International, pp. 1019-1022.
International Preliminary Report on Patentability and Written Opinion dated Jan. 29, 2015 in corresponding PCT Application No. PCT/JP2013/065336.

* cited by examiner

RADAR APPARATUS

CROSS REFERENCE TO RELATED APPLICATIONS

This application is a U.S. National Phase Application under 35 U.S.C. 371 of International Application No. PCT/JP2013/065336 filed on Jun. 3, 2013 and published in Japanese as WO 2014/013806 A1 on Jan. 23, 2014. This application is based on and claims the benefit of priority from Japanese Patent Application No. 2012-161621 filed Jul. 20, 2012. The entire disclosures of all of the above applications are incorporated herein by reference.

TECHNICAL FIELD

The present invention relates to radar apparatuses that transmit a radar wave (an electromagnetic wave) responding to a high-frequency signal, receive a reflected wave of the radar wave and determine information about a target which has reflected the radar wave.

BACKGROUND ART

For example, a FMCW (Frequency-Modulated Continuous-Wave) radar is configured to include: an antenna section that transmits a radar wave and receives a reflected wave of the radar wave; a high-frequency circuit section that generates a high-frequency signal, mixes a reception signal outputted from the antenna section with the high-frequency signal and extracts a frequency component equal to the difference between the frequencies of the two signals; and a low-frequency circuit section that processes a low-frequency signal representing the frequency component and thereby obtains necessary information.

Figure 5:
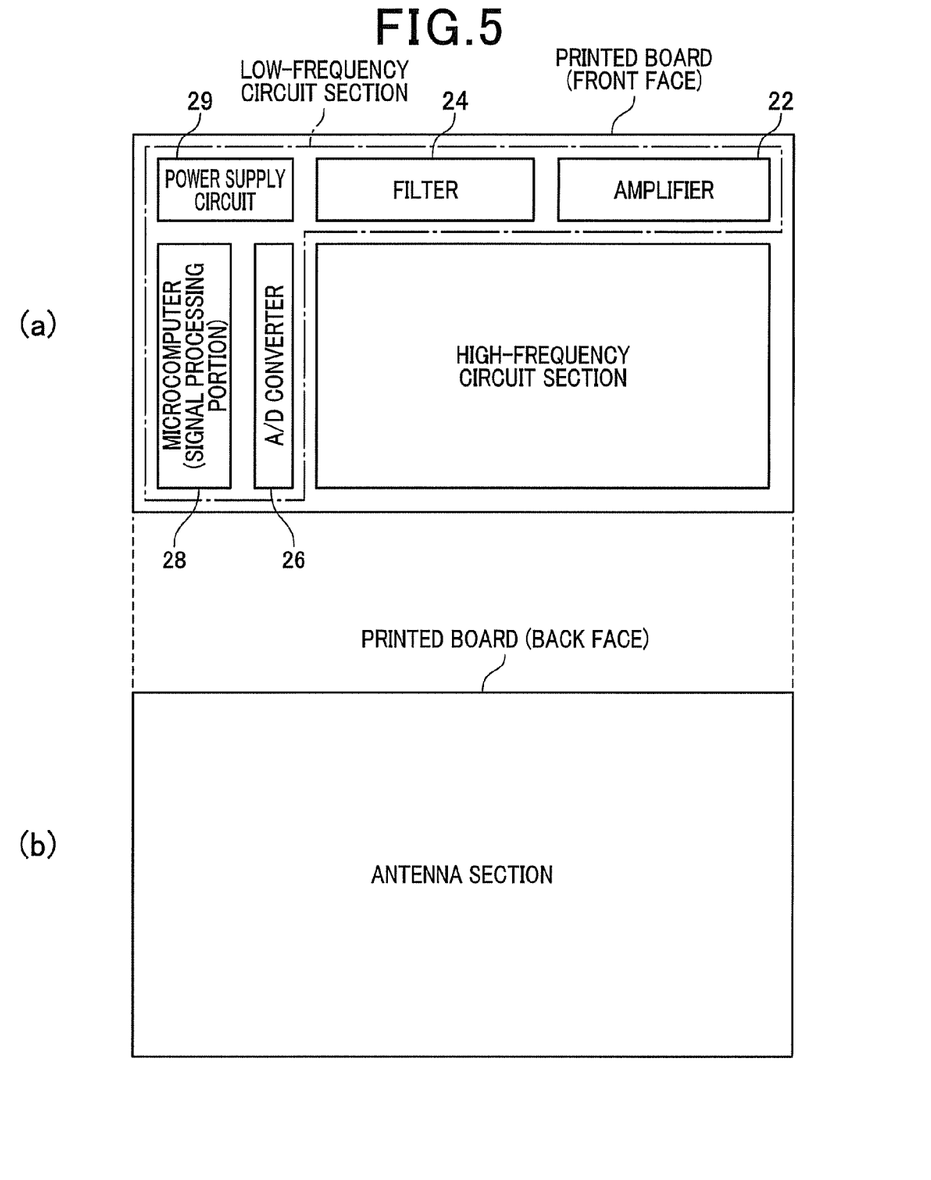
FIG. 5 is a schematic view illustrating the arrangement of parts in a conventional radar apparatus, wherein (a) shows a front face of a printed board and (b) shows a back face of the printed board.

Moreover, as configurations of arranging the above sections on printed boards, there are known both a configuration of arranging the antenna section and the high-frequency circuit section on a front face of a single printed board and the low-frequency circuit section on a back face of the same (see Patent Document 1) and a configuration of arranging the high-frequency circuit section and the low-frequency circuit section on a front face of a single printed board and the antenna section on a back face of the same (see FIG. 5).

In addition, as illustrated in FIG. 5(a), the low-frequency circuit section is configured with: an amplifier 22 that amplifies the low-frequency signal; a filter 24 that performs, on an input signal, filtering for allowing only frequency components within a predetermined range to pass therethrough; an A/D converter 26 that converts an analog signal into digital data; a microcomputer 28 that performs signal processing based on the digital data; and a power supply circuit 29 that supplies each part of the apparatus with electric power necessary for operation.

PRIOR ART LITERATURE

Patent Literature

[PATENT DOCUMENT 1] Japanese Patent Application Publication No. JPH10261917A

SUMMARY OF THE INVENTION

Problems to be Solved by the Invention

In recent years, for improving the directivity (straightness) of radar waves and thereby extending the detection range of targets, there has been a need to use high-frequency signals with higher frequencies, such as millimeter waves.

In meeting such a need, it is effective to use a board made of a special insulating material (e.g., fluorocarbon resin such as tetrafluoroethylene) having a lower dielectric dissipation factor than an ordinary insulating material (e.g., glass epoxy resin or paper phenol) and thereby suppress an energy loss (dielectric loss) that is proportional to the signal frequency and the dielectric dissipation factor.

However, with the conventional configurations of arranging all of the antenna section, the high-frequency circuit section and the low-frequency circuit section on the same printed board, for suppressing the dielectric loss, it is necessary to make the entire printed board with a special insulating material. Consequently, the manufacturing cost of the radar apparatus is increased.

The present invention has been made in view of the above problems and aims to provide a radar apparatus which can use a high-frequency signal while utilizing a printed board configuration of a conventional apparatus as much as possible.

Means for Solving the Problems

A radar apparatus according to the present invention is configured to include an antenna section, a high-frequency circuit section, a low-frequency circuit section, a plate-shaped main printed board having a major face which has such an area that both the high-frequency circuit section and the low-frequency circuit section can be mounted on the major face, and a plate-shaped secondary printed board having a first face which has such an area that the high-frequency circuit section can be mounted on the first face and a second face on the back side of the first face.

The antenna section includes a transmitting antenna and a receiving antenna. The transmitting antenna transmits a radar wave (an electromagnetic wave) responding to a high-frequency signal. The receiving antenna receives a reflected wave, which is produced by reflection of the radar wave by a target, and outputs a reception signal responding to the reflected wave. The high-frequency circuit section generates the high-frequency signal and produces a low-frequency signal based on the reception signal outputted from the receiving antenna and the high-frequency signal. The low-frequency circuit section determines information about the target, which has reflected the radar wave, based on the low-frequency signal produced by the high-frequency circuit section.

The low-frequency circuit section is arranged on the major face of the main printed board. The high-frequency circuit section and the antenna section are arranged respectively on the first and second faces of the secondary printed board. Moreover, the secondary printed board is mounted to a space on the major face of the main printed board which is not occupied by the low-frequency circuit section.

That is, from the back and front faces of the printed board illustrated in FIG. 5, the antenna section and the high-frequency circuit section are respectively removed. Then, the printed board, where only the low-frequency circuit section remains, is employed as the main printed board. Further, another printed board (the secondary printed board), which has the high-frequency circuit section and the antenna section respectively arranged on the first and second faces thereof, is mounted to the vacant space which is formed on the front face (major face) of the main printed board by removing the high-frequency circuit section therefrom.

With the above configuration, it becomes possible to use the high-frequency signal (e.g., millimeter wave) having a higher frequency by using a special insulating material, which is necessary for suppression of dielectric loss, only for the secondary printed board that is smaller than the main printed board. Accordingly, it becomes unnecessary to make the entire printed board illustrated in FIG. 5 (main printed board) with the special insulating material. As a result, it becomes possible to suppress increase in the manufacturing cost of the radar apparatus.

In addition, as will be described later, in a given condition, the directivity of the radar wave is inversely proportional to the product of the used frequency of the signal and the antenna length. Therefore, by using the high-frequency signal, it becomes possible to shorten the antenna length. As a result, it becomes possible to reduce the arrangement area of the antenna section.

Hence, according to the present invention, it becomes possible to use the high-frequency signal while utilizing the printed board configuration of the conventional apparatus.

EMBODIMENT FOR CARRYING OUT THE INVENTION

Hereinafter, a radar apparatus 1 according an embodiment of the present invention will be described with reference to FIGS. 1-4. In addition, in the present embodiment, the radar apparatus 1 is used in an Adaptive Cruise Control (ACC) system of a vehicle.

Figure 1:
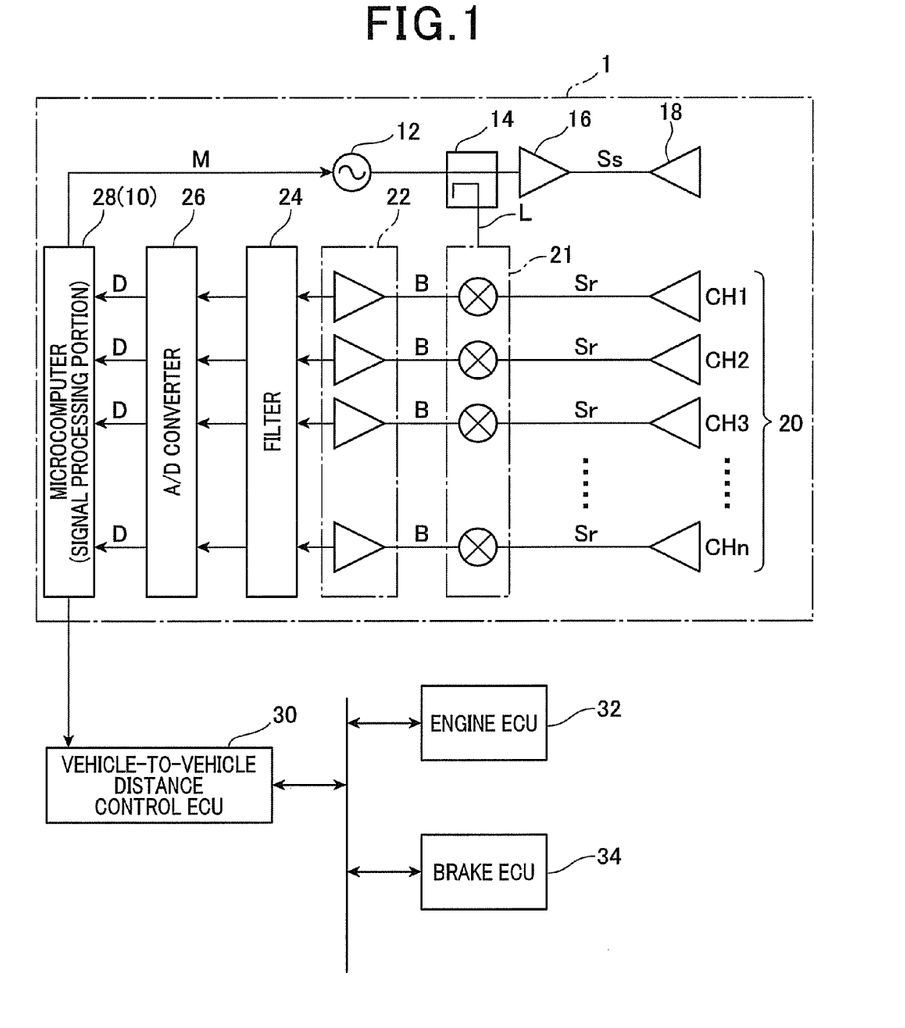
FIG. 1 is a functional block diagram illustrating the overall configuration of an ACC (Adaptive Cruise Control) system which includes a radar apparatus according to an embodiment.

As shown in FIG. 1, the ACC system includes the radar apparatus 1, a vehicle-to-vehicle distance control ECU (Electronic Control Unit) 30, an engine ECU 32 and a brake ECU 34. In addition, in the present embodiment, the radar apparatus 1 is connected with the vehicle-to-vehicle distance control ECU 30. Moreover, the ECUs 30, 32 and 34 are each configured mainly with a microcomputer and connected with one another via an in-vehicle LAN (Local Area Network).

The radar apparatus 1 is configured as a so-called millimeter-wave radar which is of FMCW type. Specifically, the radar apparatus 1 transmits a frequency-modulated millimetric electromagnetic wave as a radar wave in an advancing direction of the subject vehicle (forward in the present invention), receives a reflected wave of the radar wave, produces information about a target which has reflected the radar wave (to be referred to as target information hereinafter), and sends the produced target information to the vehicle-to-vehicle distance control ECU 30.

In addition, the target information includes, at least, the position (distance, azimuth) and relative speed of the target. For example, the target information includes the distance and relative speed between another vehicle (preceding vehicle), which is present in front of the subject vehicle as the target, and the subject vehicle and the azimuth in which the preceding vehicle is present.

Based on the target information sent from the radar apparatus 1 and information that is detected by various sensors (not shown in the figures) and indicative of the state of the subject vehicle, the vehicle-to-vehicle distance control ECU 30 sends control commands to the engine ECU 32 and the brake ECU 34 so as to keep the distance between the subject vehicle and the preceding vehicle longer than or equal to a predetermined distance.

The engine ECU 32 controls an engine of the vehicle according to the amount of manipulation of an accelerator pedal and the control command from the vehicle-to-vehicle distance control ECU 30.

The brake ECU 34 controls a brake apparatus of the vehicle based on the state of manipulation of a brake pedal and the control command from the vehicle-to-vehicle distance control ECU 30.

That is, in the ACC system, according to the target information detected by the radar apparatus 1 and the state of the subject vehicle, the running speed of the subject vehicle is automatically controlled, by controlling the engine and brake apparatus of the subject vehicle, so as to keep the distance between the preceding vehicle and the subject vehicle longer than or equal to the predetermined distance.

Next, the configuration of the radar apparatus 1 according to the present embodiment will be described.

The radar apparatus 1 includes: a signal processing portion 10 that generates a triangular wave-shaped modulation signal according to a modulation command M; a Voltage-controlled oscillator (VCO) 12 that receives the modulation signal generated by the signal processing portion 10 and varies the oscillating frequency of the output signal thereof according to the modulation signal; a splitter 14 that power-splits the output signal of the VCO 12 into a transmission signal Ss and a local signal L; an amplifier 16 that amplifies the transmission signal Ss outputted from the splitter 14; and a transmitting antenna 18 that radiates, as the radar wave, an electromagnetic wave responding to the transmission signal Ss amplified by the amplifier 16.

Moreover, the radar apparatus 1 also includes: n (n=6 in the present embodiment) receiving antennas 20 that each receive the reflected wave of the radar wave and output a reception signal Sr responding to the reflected wave; a mixer 21 that mixes the reception signal Ss outputted from the receiving antennas 20 with the local signal L to produce a beat signal B; an amplifier 22 that amplifies the beat signal B produced by the mixer 21; a filter 24 that performs, on the beat signal B amplified by the amplifier 22, filtering for allowing only frequency components within a predetermined range to pass therethrough; an A/D converter 26 that converts the beat signal having passed through the filter 24 into digital data D; a microcomputer 28 that reads in the digital data D and determines the target information by performing signal processing based on the digital data D;

and a power supply circuit 29 (see FIG. 3) that supplies each part of the radar apparatus 1 with electric power necessary for operation.

The VCO 12 generates and outputs the millimetric high-frequency signal; the signal is modulated according to the triangular wave-shaped modulation signal so that its frequency gradually increases and gradually decreases in a linear fashion. In addition, the VCO 12 is set so that the center frequency of the high-frequency signal is equal to Fo (e.g., 76.5 GHz) and the frequency variation of the high-frequency signal is equal to ΔF (e.g., 100 MHz).

The receiving antennas 20 are set so that the beam width (the angular range within which decrease in gain with respect to the front direction is less than or equal to 3 dB) of each of the receiving antennas 20 includes the entire beam width of the transmitting antenna 18. In addition, the receiving antennas 20 are respectively assigned to channels CH1-CHn.

The A/D converter 26 is set so as to operate according to a timing signal (not shown in the figures) which is composed of a pulse train with a period of Tp (e.g., 200 ns) and outputted from the microcomputer 28.

The mixer 21 converts the input signals (the reception signal Sr, the local signal L), which fall within a frequency range of ±several GHz with its center being the center frequency Fo of the high-frequency signal generated by the VCO 12, into a low-frequency signal that has a frequency equal to the difference between the frequencies of the two input signals.

The microcomputer 28 includes a CPU, a ROM and a RAM and is configured as part of the signal processing portion 10. Further, the microcomputer 28 includes an arithmetic processing unit (e.g., a DSP) which performs signal processing such as a frequency analysis (here, a Fast Fourier Transform (FFT)).

Moreover, the CPU of the microcomputer 28 performs, at least, an operation control process for controlling operation of each part of the radar apparatus 1 by generating the modulation command M and the above-described timing signal and a target detection process for determining the target information based on the results of calculation at the arithmetic processing unit.

Next, the principle of the target detection process will be described.

Figure 2:
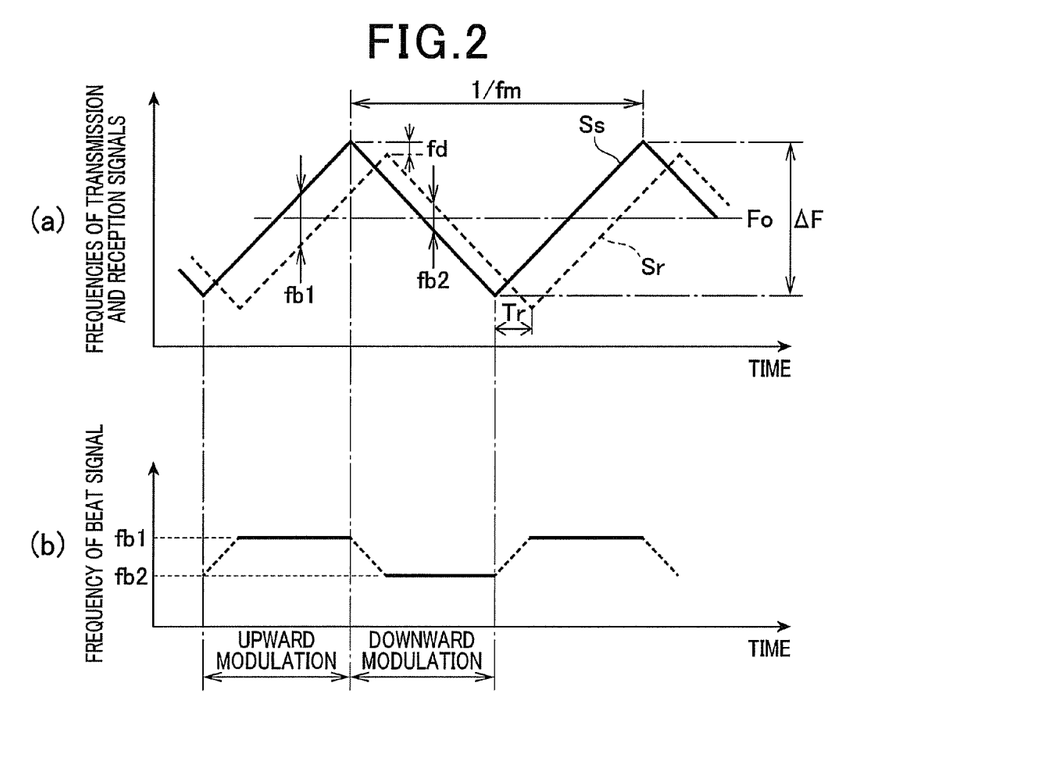
FIG. 2 is a schematic view illustrating the operating principle of an FMCW radar, wherein (a) shows the changes in frequency of a transmission signal and a reception signal with time, and (b) shows the change in frequency of a beat signal with time.

The radar apparatus 1 transmits as the radar wave the transmission signal Ss, which is frequency-modulated according to the triangular wave-shaped modulation signal so that its frequency gradually increases and decreases in the linear fashion with time as indicated with a continuous line in FIG. 2(a), and receives the reflected wave that is produced by reflection of the radar wave by the target. Here, as indicated with a dotted line in FIG. 2(a), the reception signal Sr is delayed by the time necessary for the radar wave to make a round trip between the subject vehicle and the target, i.e., by the time Tr that is dependent on the distance from the subject vehicle to the target; the reception signal Sr is also Doppler-shifted by the frequency fd that is dependent on the relative speed between the subject vehicle and the target.

By mixing the above reception signal Sr and transmission signal Ss by the mixer 21, as shown in FIG. 2(b), the beat signal B is produced which has the frequency equal to the difference between the frequencies of the two signals Sr and Ss. In addition, using the frequency fb1 of the beat signal B when the frequency of the transmission signal Ss increases (to be referred to as "the beat frequency during the upward modulation" hereinafter) and the frequency fb2 of the beat signal B when the frequency of the transmission signal Ss decreases (to be referred to as "the beat frequency during the downward modulation" hereinafter), the average frequency fr of the beat signal B can be represented by Equation (1), and the Doppler shift frequency fd can be represented by Equation (2).

Moreover, in the target detection process, based on the beat frequencies fr and fd, the distance R and relative speed V between the subject vehicle and the target are determined by Equations (3) and (4).

$$fr = \frac{fb1 + fb2}{2} \quad (1)$$

$$fd = \frac{fb1 - fb2}{2} \quad (2)$$

$$R = \frac{c \cdot fr}{4 \cdot fm \cdot \Delta F} \quad (3)$$

$$V = \frac{c \cdot fd}{2 \cdot Fo} \quad (4)$$

In addition, c is the radio wave propagation speed, fm is the modulation frequency of the transmission signal Ss, ΔF is the frequency variation of the transmission signal Ss and Fo is the center frequency of the transmission signal Ss.

Moreover, in determining the beat frequencies fb1 and fb2, signal processing is generally performed. Specifically, the beat signal B is sampled to determine the frequency distribution of the beat signal B in each of the upward and downward intervals of the modulation. Then, the frequencies at which the signal strength reaches its peaks are determined as the beat frequencies fb1 and fb2.

In addition, as well known, it is necessary to set the sampling frequency fs of the beat signal B to be two or more times the highest possible frequency of the beat signal B. That is, the modulation width ΔF and modulation period 1/fm of the radar wave are set so that the frequency of the beat signal B, which is produced based on the reflected wave from the target present in a preset detection range, falls within the signal band lower than or equal to the highest possible frequency.

Moreover, the azimuth of the target will be described. For example, the transition frequency between the beat frequencies fr, which respectively correspond to the reception signals Sr of the plurality of receiving antennas 20 based on the reflected wave returning from the target present right in front of the subject vehicle, is equal to zero. The transition frequency between the beat frequencies fd, which respectively correspond to the reception signals Sr of the plurality of receiving antennas 20 based on the reflected wave returning from the target present right in front of the subject vehicle, is also equal to zero. On the other hand, the transition frequency between the beat frequencies fr, which respectively correspond to the reception signals Sr of the plurality of receiving antennas 20 based on the reflected wave returning from the target with an angle (obliquely) to the advancing direction of the subject vehicle, is not equal to zero and dependent on the differences between the paths from the transmitting antenna 18, via the target, to the respective receiving antennas 20. The transition frequency between the beat frequencies fd, which respectively correspond to the reception signals Sr of the plurality of receiving antennas 20 based on the reflected wave returning from the target with the angle (obliquely) to the advancing direction of the subject vehicle, is also not equal to zero and dependent on the differences between the paths from the transmitting antenna 18, via the target, to the respective receiving antennas 20. Therefore, it is possible to obtain the horizontal azimuth angle of the target (the arrival angle of the reflected wave) by measuring the transition frequency between the beat frequencies fr respectively corresponding to the reception signals Ss of the plurality of receiving antennas 20 and the transition frequency between the beat frequencies fd respectively corresponding to the reception signals Ss of the plurality of receiving antennas 20.

Next, the arrangement of each part in the radar apparatus 1 will be described.

Figure 3:
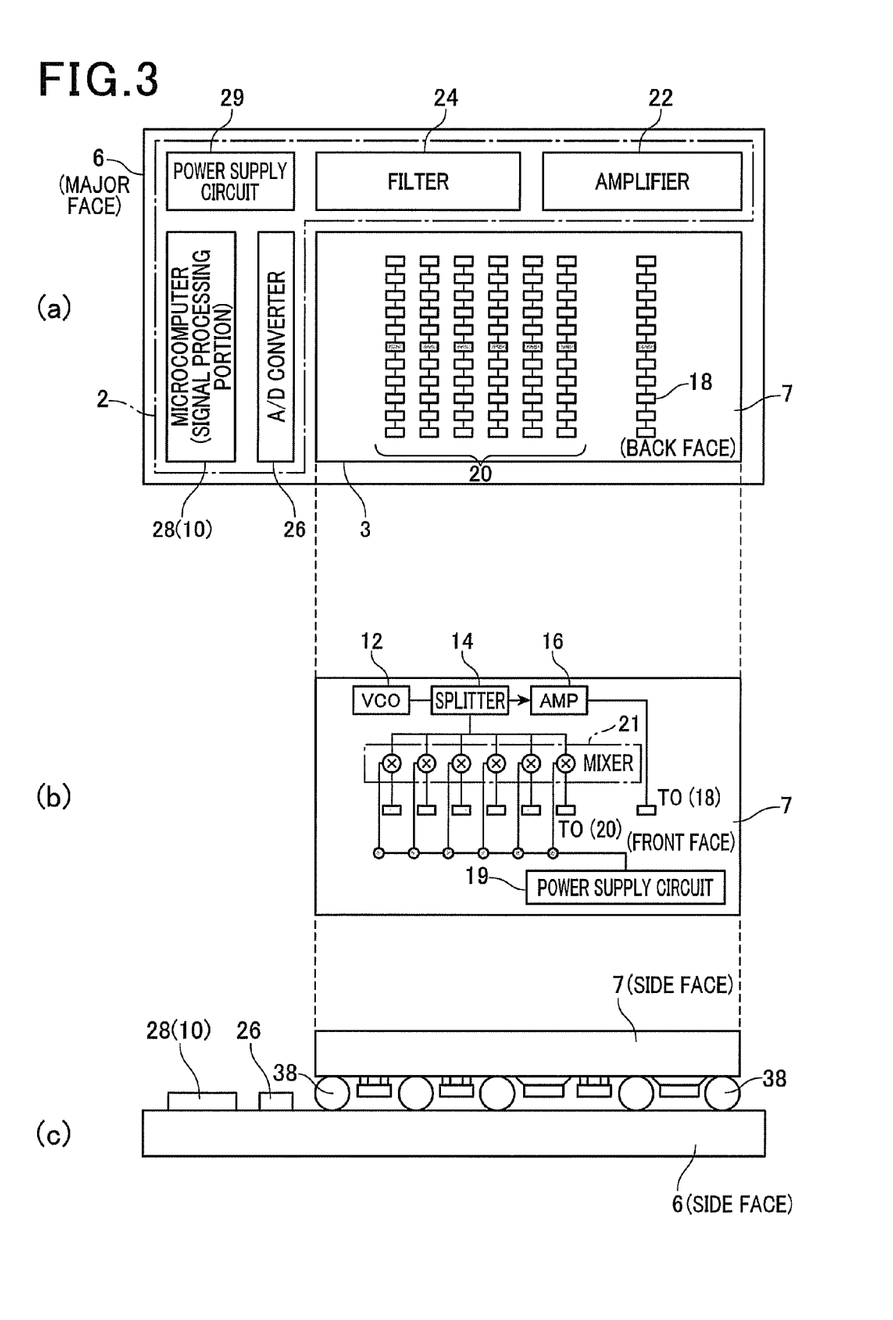
FIG. 3 is a schematic view illustrating the arrangement of parts in the radar apparatus, wherein (a) shows a front face (major face) of a main printed board and a back face (second face) of a secondary printed board, and (b) shows a front face (first face) of the secondary printed board and (c) shows side faces of the main printed board and the secondary printed board.

As shown in FIG. 3, in the radar apparatus 1, a low-frequency circuit section 2, an antenna section 3 and a high-frequency circuit section 4 are mounted on two plate-shaped printed boards.

Specifically, the antenna section 3 is comprised of the transmitting antenna 18 and the plurality of receiving antennas 20. The transmitting antenna 18 is arranged parallel with and apart by a predetermined distance d1 from one of the receiving antennas 20 which is adjacent to the transmitting antenna 18. Moreover, the receiving antennas 20 are arranged parallel with one another so that any adjacent two of the receiving antennas 20 are apart from each other by a predetermined interval d2 (here, d2<d1).

The low-frequency circuit section 2 is comprised of the amplifier 22, the filter 24, the A/D converter 26, the signal processing portion 10 (including the microcomputer 28), the power supply circuit 29 and wiring patterns electrically connecting the aforementioned parts. That is, the low-frequency circuit section 2 is comprised of those parts of the radar apparatus 1 which mainly handle the low-frequency signal.

On the other hand, the high-frequency circuit section 4 is comprised of the VCO 12, the splitter 14, the amplifier 16, the mixer 21 and wiring patterns electrically connecting the aforementioned parts. That is, the high-frequency circuit section 4 is comprised of those parts of the radar apparatus 1 which mainly handle the high-frequency signal. In addition, in the high-frequency circuit section 4, there may be included a power supply circuit 19 independent of the above-described power supply circuit 29; the power supply circuit 19 supplies each part of the high-frequency circuit section 4 with electric power necessary for operation.

Moreover, of the two boards, the larger one is a main printed board 6 and the smaller one is a secondary printed board 7.

Similar to the printed board of the conventional apparatus shown in FIG. 5, the main printed board 6 is made of an ordinary insulating material such as glass epoxy resin or paper phenol. Moreover, a major face of the main printed board 6 has such an area that both the low-frequency circuit section 2 and the high-frequency circuit section 4 can be mounted on the major face.

In the present embodiment, compared to the printed board of the conventional apparatus shown in FIG. 5, the main printed board 6 has the high-frequency circuit section 4 removed from the front face (major face) and the antenna section 3 from the back face while keeping the low-frequency circuit section 2 arranged on the major face. Consequently, on the major face of the main printed board 6, there exist a region where the low-frequency circuit section 2 is arranged and a vacant space not occupied by the low-frequency circuit section 2.

On the other hand, the secondary printed board 7 is made of an insulating material having a lower dielectric dissipation factor than the main printed board 6, for example fluorocarbon resin such as tetrafluoroethylene. The secondary printed board 7 has such a size that it can be arranged on the vacant space of the major face of the main printed board 6.

In the present embodiment, as shown in FIG. 3(c), the secondary printed board 7 is mounted (fixed), with its front face facing downward, to the main printed board 6 via connecting metal 38 such as solder bumps (e.g., bumps of gold-based solder).

That is, in the present embodiment, the secondary printed board 7 is mounted to the main printed board 6 so as to have its front face (first face) facing the major face of the main printed board 6.

Moreover, on the front face of the secondary printed board 7, there is arranged the high-frequency circuit section 4. The connecting metal 38 electrically connects the low-frequency circuit section 2 arranged on the major face of the main printed board 6 with the high-frequency circuit section 4 arranged on the front face of the secondary printed board 7.

Moreover, on the back face (second face) of the secondary printed board 7, there is arranged the antenna section 3. The radar apparatus 1 is installed to the vehicle so that the antenna section 3 faces forward. In addition, in the radar apparatus 1, there may be provided a radome to protect the antenna section 3.

In the present embodiment, since the antenna section 3 is arranged on the back face of the secondary printed board 7, the arrangement area thereof is reduced in comparison with the antenna section of the conventional apparatus shown in FIG. 5. Therefore, the transmitting antenna 18 and receiving antennas 20 included in the antenna section 3 are formed to have a shorter antenna length Da than the antennas of the conventional apparatus.

Figure 4:
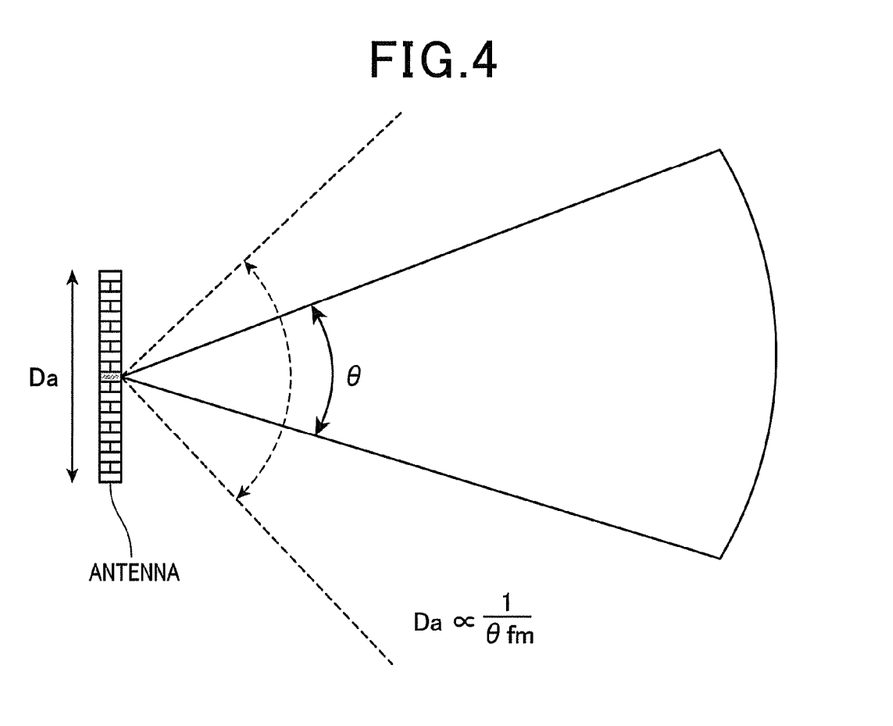
FIG. 4 is a schematic view illustrating the relationship between the directivity of an antenna, the length of the antenna and the used frequency of a signal.

In general, as shown in FIG. 4, when the beam width (spread angle) θ of an antenna is given, the shorter the signal wavelength (in other words, the higher the used frequency fm of the signal), the shorter the necessary antenna length Da for securing the directivity of the antenna is. Therefore, in the radar apparatus 1 according to the present embodiment, by using the high-frequency signal (e.g., millimeter wave) having a higher frequency in comparison with the conventional apparatus, it becomes possible to shorten the antenna length Da and thereby reduce the arrangement area of the antenna section 3.

As described above, in the radar apparatus 1 according to the present embodiment, it becomes possible to use a high-frequency signal (e.g., millimeter wave) having a higher frequency by using the special insulating material, which is necessary for suppression of dielectric loss, only for the secondary printed board 7 that is smaller than the main printed board 6. Consequently, it becomes possible to suppress the manufacturing cost in comparison with the case of making the entire printed board of the conventional apparatus using the special insulating material instead of the ordinary insulating material.

Moreover, in the radar apparatus 1 according to the present embodiment, the secondary printed board 7 is mounted to the main printed board 6 so that the first face (front face) of the secondary printed board 7 faces the major face of the main printed board 6. Consequently, the high-frequency circuit section 4, which is arranged on the first face of the secondary printed board 7, is shielded by the main printed board 6 and the secondary printed board 7. Therefore, it is difficult for noise from the outside to enter the high-frequency circuit section 4; it is also difficult for noise to leak from the high-frequency circuit section 4 to the outside. As a result, the reliability of the radar apparatus 1 is improved.

Moreover, in the radar apparatus 1 according to the present embodiment, the secondary printed board 7 is mounted to the main printed board 6 via the connecting metal 38 such as solder bumps. Consequently, compared to the case of connecting the two boards 6 and 7 using connectors, it becomes possible to reduce the area of connecting portions between the two boards while securing electrical connection therebetween. As a result, it becomes easy to secure the arrangement area of the high-frequency circuit section 4.

Moreover, in the radar apparatus 1 according to the present embodiment, it becomes possible to extend the detection range of the target by using the high-frequency signal (e.g., millimeter wave) having the higher frequency. Therefore, the radar apparatus 1 can be suitably used as an apparatus for determining information about another vehicle, which is present in front of the subject vehicle in the advancing direction as the target, and calculating the distance between the another vehicle and the subject vehicle.

The embodiment of the present invention has been described above. However, the present invention is not limited to the above-described embodiment and can be carried out in various ways without departing from the spirit of the invention.

For example, in the above-described embodiment, the secondary printed board 7 is mounted to the main printed board 6 so that the first face (front face) of the secondary printed board 7 faces the major face of the main printed board 6. However, the secondary printed board 7 may be mounted to the main printed board 6 so that the second face (back face) of the secondary printed board 7 faces the major face of the main printed board 6.

Moreover, in the above-described embodiment, the present invention is applied to the FMCW radar apparatus 1. However, the present invention can also be applied to radar apparatuses of other types, such as a two-frequency CW radar apparatus and a pulse radar apparatus.

DESCRIPTION OF REFERENCE SIGNS

1: radar apparatus; 2: low-frequency circuit section; 3: antenna section; 4: high-frequency circuit section; 6: main printed board; 7: secondary printed board; 10: signal processing portion; 14: splitter; 16: amplifier; 18: transmitting antenna; 20: receiving antennas; 21: mixer; 22: amplifier; 24: filter; 26: A/D converter; 28: microcomputer; 38: connecting metal.

What is claimed is:

1. A radar apparatus comprising:
an antenna section including a transmitting antenna and a receiving antenna, the transmitting antenna transmitting a radar wave responding to a high-frequency signal, the receiving antenna receiving a reflected wave, which is produced by reflection of the radar wave by a target, and outputting a reception signal responding to the reflected wave;
a high-frequency circuit section that generates the high-frequency signal and produces a low-frequency signal based on the reception signal outputted from the receiving antenna and the high-frequency signal;
a low-frequency circuit section that determines information about the target, which has reflected the radar wave, based on the low-frequency signal produced by the high-frequency circuit section;
a plate-shaped main printed board having a major face, the major face having such an area that both the high-frequency circuit section and the low-frequency circuit section can be mounted on the major face; and
a plate-shaped secondary printed board having first and second faces, the first face having such an area that the high-frequency circuit section can be mounted on the first face, the second face being on a back side of the first face,
wherein
the low-frequency circuit section is arranged on the major face of the main printed board,
the high-frequency circuit section and the antenna section are arranged respectively on the first and second faces of the secondary printed board, and
the secondary printed board is mounted to a space on the major face of the main printed board which is not occupied by the low-frequency circuit section.

2. The radar apparatus as set forth in claim 1, wherein the secondary printed board is mounted to the main printed board so that the first face of the secondary printed board faces the major face of the main printed board.

3. The radar apparatus as set forth in claim 1, wherein the secondary printed board is mounted to the main printed board via connecting metal.

4. The radar apparatus as set forth in claim 1, wherein the radar apparatus is installed in a vehicle,
the target is another vehicle which is present in front of the vehicle in an advancing direction of the vehicle, and
the low-frequency circuit section is configured to calculate a distance between the another vehicle and the vehicle.

5. The radar apparatus as set forth in claim 1, wherein the main printed board is made of a first insulating material,
the secondary printed board is made of a second insulating material, and
a dielectric dissipation factor of the second insulating material is lower than a dielectric dissipation factor of the first insulating material.

* * * * *